United States Patent [19]

Kinugasa et al.

[11] Patent Number: 5,034,629
[45] Date of Patent: Jul. 23, 1991

[54] OUTPUT CONTROL CIRCUIT FOR REDUCING THROUGH CURRENT IN CMOS OUTPUT BUFFER

[75] Inventors: Masanori Kinugasa, Yokohama; Fuminari Tanaka, Tokyo; Satoshi Nonaka, Tokyo; Munenobu Kida, Tokyo, all of Japan

[73] Assignee: Kabushiki Kaisha Toshiba, Kawasaki, Japan

[21] Appl. No.: 552,855

[22] Filed: Jul. 16, 1990

Related U.S. Application Data

[63] Continuation of Ser. No. 251,720, Sep. 30, 1988, abandoned.

[30] Foreign Application Priority Data

Jun. 2, 1988 [JP] Japan ................................ 63-136366

[51] Int. Cl.⁵ ................. H03K 19/003; H03K 19/094; H03K 19/092; H03K 17/16
[52] U.S. Cl. ..................................... 307/448; 307/475; 307/443; 307/451; 307/542; 307/279; 307/585; 307/290
[58] Field of Search ............... 307/475, 450, 451, 443, 307/585, 576, 579, 255, 288, 542, 558, 568, 290, 603; 365/104, 156, 181, 190

[56] References Cited

U.S. PATENT DOCUMENTS

| 4,295,062 | 10/1981 | Mihalich et al. | 307/279 |
| 4,438,352 | 3/1984 | Mardkha | 307/451 X |
| 4,507,649 | 3/1985 | Dingwall et al. | 307/585 X |
| 4,563,594 | 1/1986 | Koyama | 307/451 X |
| 4,725,747 | 2/1988 | Stein et al. | 307/579 |
| 4,806,802 | 2/1989 | Okitaka et al. | 307/542 |

FOREIGN PATENT DOCUMENTS

| 0189571 | 8/1986 | European Pat. Off. . |
| 0258808 | 3/1988 | European Pat. Off. . |
| 0141828 | 11/1980 | Japan ................................ 307/451 |
| 61-109320 | 5/1986 | Japan . |
| 61-244124 | 10/1986 | Japan . |

OTHER PUBLICATIONS

Dingwell, "Improved COS/MOS Inverter Circuit for Reducing Burn-Out and Latch-Up", RCA Tech. Notes, TN 1230, pp. 1-4, Jul. 1979.
Y. Kawahara et al., "Advanced CMOS Logic Family", Toshiba Review, vol. 42-10, pp. 761-764, 1987.
Glasford, "Digital Electronic Circuits", 1988, pp. 273-276.

Primary Examiner—Stanley D. Miller
Assistant Examiner—David R. Bertelson
Attorney, Agent, or Firm—Finnegan, Henderson, Farabow, Garrett, and Dunner

[57] ABSTRACT

In an output circuit for use in a semiconductor IC comprising a CMOS transistors constituting an output buffer, a transfer gate of CMOS structure is connected between the gates of the CMOS transistors as a resistive element. The transfer gate reduces the changes in the gate potentials of output transistors, which occur when logic inputs are supplied to the gates of the output control transistors. Hence, the deformation of the output waveform, which has resulted from the through currents flowing through the output transistors, is minimized.

15 Claims, 6 Drawing Sheets

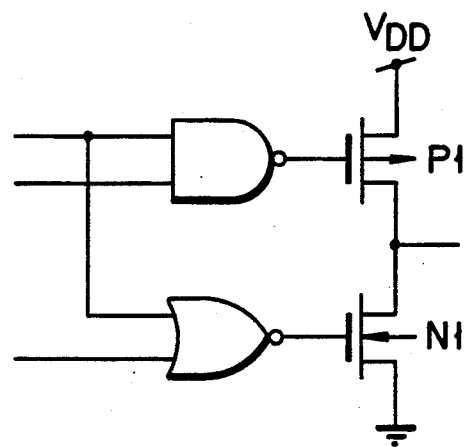
F I G. 1
(PRIOR ART)
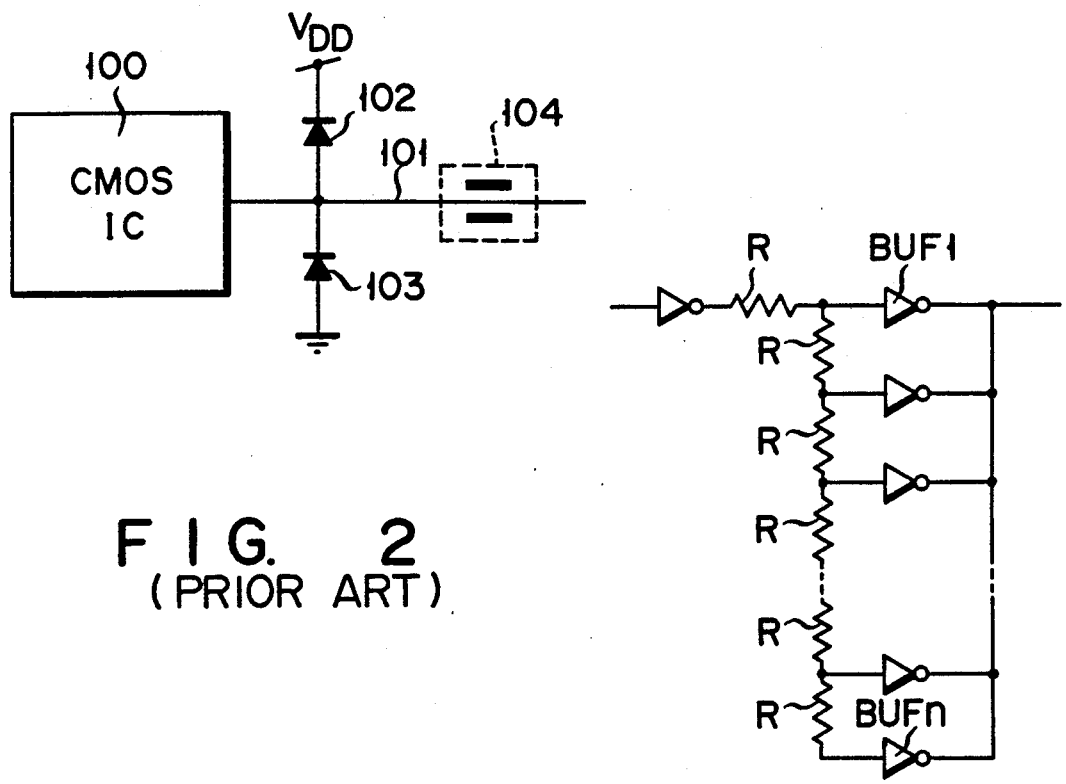
F I G. 2
(PRIOR ART)
F I G. 3
(PRIOR ART)

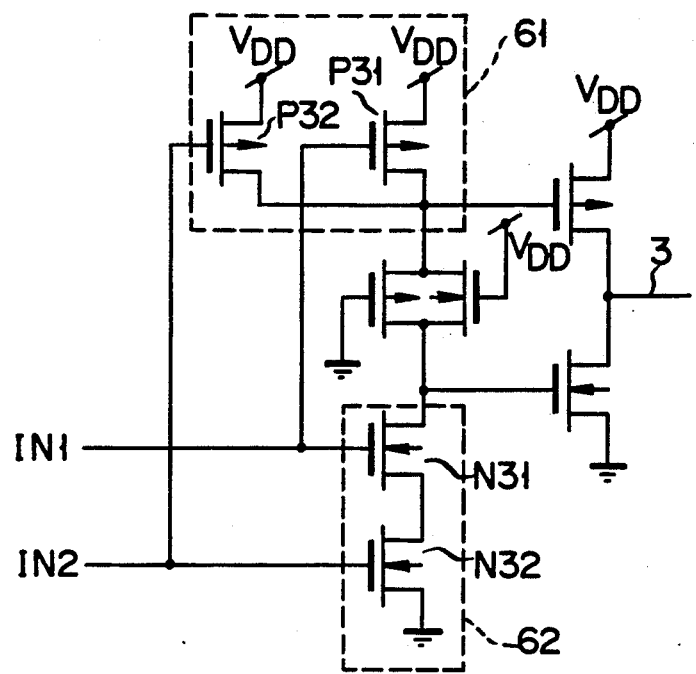
F I G. 10
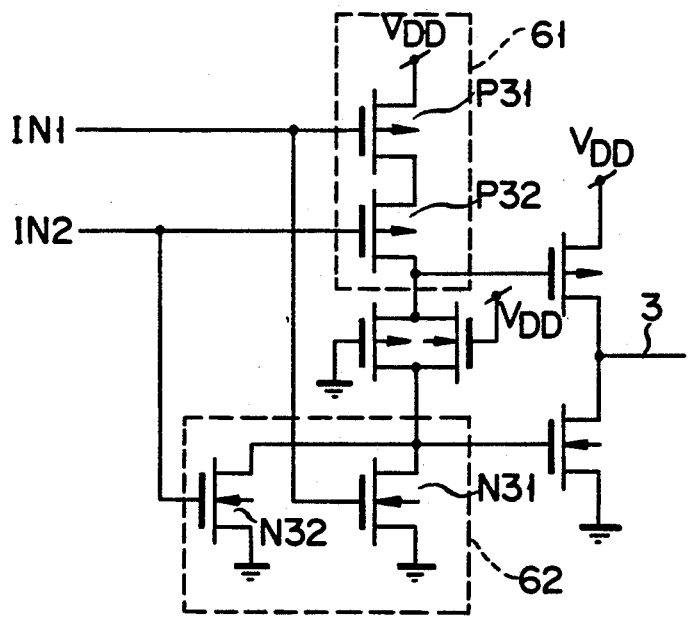
F I G. 11

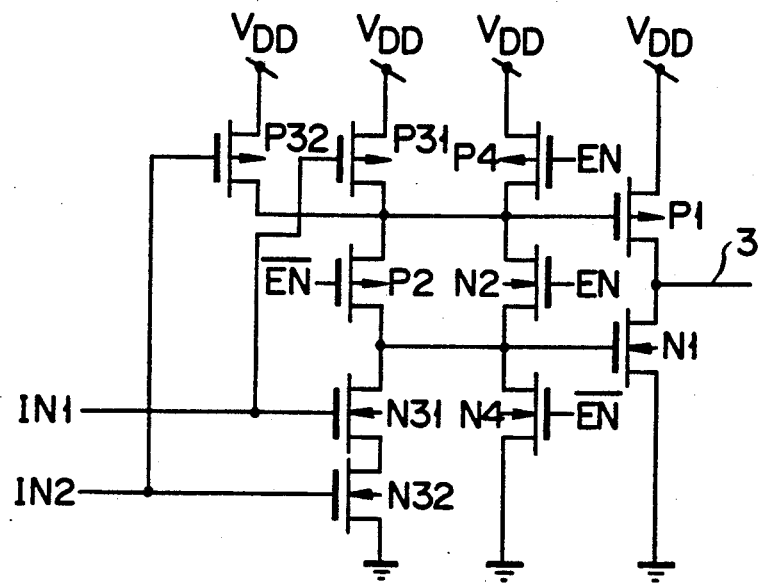
F I G. 14
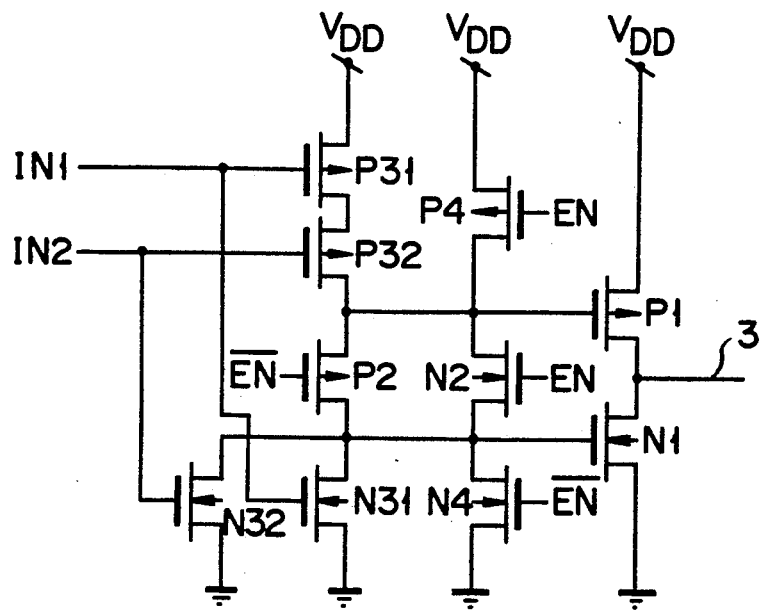
F I G. 15

OUTPUT CONTROL CIRCUIT FOR REDUCING THROUGH CURRENT IN CMOS OUTPUT BUFFER

This application is a continuation of application Ser. No. 07,251,720, filed Sept. 30, 1988, now abandoned.

BACKGROUND OF THE INVENTION

1. Field of the Invention

The present invention relates to an output circuit for use in a semiconductor IC (integrated circuit) and, more particularly, to an output control circuit which is connected to the input of a CMOS (complementary metal oxide semiconductor) output buffer.

2. Description of the Related Art

Recently there has been a need in the field of MOS IC for an IC which has a transfer delay time as long as that of a Schottky TTL (transistor-transistor logic), and outputs a large current. To meet this need, it is generally necessary to increase the transconductances of output buffer MOS FETs (field-effect transistors) P1 and N1 of such an output circuit as is illustrated in FIG. 1. When the transconductance of either MOS FET is increased, however, the DC resistance component of the MOS FET decreases. As a result of this, the output waveform of the output circuit is greatly influenced by the parasitic capacitance of the power-supply line or the output line of the output circuit, or by the inductive load of the output circuit. The deformation of the output waveform, either an overshoot or an undershoot, become too prominent. In order to reduce this deformation, an inductance element, such as ultra-high speed switching, planar diodes 102 and 103 or a ferrite bead 104, is connected to output signal line 101 of CMOS IC 100, as is illustrated in FIG. 2. In the case of such an output circuit having two or more output buffers BUF1 to BUFn as is shown in FIG. 3, to reduce the deformation of the output waveform, resistance components R of gate lines 105 are utilized, thereby turning on buffers BUF1 to BUFn sequentially, and moderating the change of the output waveform.

In the case of the output circuit shown in FIG. 2, planar diodes 102 and 103 or ferrite bead 104 is formed on the substrate, along with an IC. Also, in the case of the output circuit shown in FIG. 3, resistance components R are formed on the substrate, together with an IC. In either case, the substrate must be made larger. Since an IC device corresponding to, shown in FIG. 2 or FIG. 3 either requires additional elements for reducing the deformation of the output waveform, or a large substrate, it cannot be manufactured at sufficiently low cost.

Moreover, in the output circuit shown in FIG. 3, wherein the resistance components of the gate line serve to reduce the deformation of the output waveform, both the P-channel MOS transistor and the N-channel MOS transistor of each buffer, which are connected in series, are turned on when the output of the buffer changes (either from a low level to a high level, or vice versa). The two MOS transistors, which correspond to MOS FETs-P1 and N1 both shown in FIG. 1, remain on for a long period of time. During this period, a through current flows between the $V_{DD}$ power terminal and the ground terminal, via the N-channel MOS transistor and the P-channel MOS transistor. Hence, the power-supply potential and the ground potential (both within the IC) change, further deforming the output waveform of the output circuit.

SUMMARY OF THE INVENTION

The object of the present invention is to provide, an output circuit for use in a semiconductor IC, which can suppress an overshoot or an undershoot of the output waveform, without using any external circuit, and in which no through current flows when the output signal changes in level.

According to the invention, there is provided an output circuit for use in a semiconductor IC, which comprises a first MOS transistor of a first conductivity type and a second MOS transistor of a second conductivity connected in series to each other between a first power supply and a second power supply, and constituting an output buffer; a resistor element connected between gates of the first and second MOS transistors; a first logic-element section comprising at least one third MOS transistor of the first conductivity type, connected between the first power supply and the gate of the first MOS transistor, the third MOS transistor being connected to receive an input signal; and a second logic-element section comprising at least one fourth MOS transistor of the second conductivity type, connected between the second power supply and the gate of the second MOS transistor, the fourth MOS transistor being connected to receive the input signal.

According to the invention, there is provided another output circuit which is identical to the output circuit described above, except that a fifth MOS transistor of a first conductivity type is connected between the first power supply and the gate of the first MOS transistor, a sixth MOS transistor of the second conductivity type is connected between the second power supply and the gate of the second MOS transistor, a first output control signal is supplied to the gates of the fourth and fifth MOS transistors and a second output control signal, which is complementary to the first output control signal, is supplied to the gates of the third and sixth MOS transistors.

According to the invention, there is provided still another output circuit for use in a semiconductor IC, which comprises a first MOS transistor of a first conductivity type and a second MOS transistor of a second conductivity connected in series to each other between a first power supply and a second power supply, and constituting an output buffer; a third MOS transistor of the first conductivity type and a fourth MOS transistor of the second conductivity type connected in parallel to each other between gates of the first and second MOS transistors; a first logic-element section comprising at least one fifth MOS transistor of the first conductivity type connected between the first power supply and the gate of the first MOS transistor, the fifth MOS transistor being connected to receive an input signal; and a second logic-element section comprising at least one sixth MOS transistor of the second conductivity type connected between the second power supply and the gate of the second MOS transistor, the sixth MOS transistor being connected to receive the input signal, wherein the third and fourth MOS transistors have a channel width smaller than that of said fifth and sixth MOS transistors.

According to the invention, there is provided a further output circuit which is identical to the output circuit described in the preceding paragraph, except that a seventh MOS transistor of the first conductivity type is connected between the first power supply and the gate of the first MOS transistor, an eighth MOS transistor of the second conductivity type is connected between the second power supply and the gate of the second MOS transistor, a first output control signal is supplied to the gates of the fourth and seventh MOS transistors, and a second output control signal, which is complementary to the first output control signal, is supplied to the gates of the third and eighth MOS transistors, wherein the third and fourth MOS transistors have a channel width smaller than that of said fifth and sixth MOS transistor and also than that of said seventh and eighth MOS transistors.

In the third output circuit according to the present invention, the third MOS transistor and the fourth MOS transistor, both functioning as resistor elements, are connected in parallel to each other, and are incorporated in the output control circuit coupled to the input of a CMOS output buffer. The third and fourth MOS transistors, therefore, reduce the changes in the gate potentials of the first and second MOS transistors constituting the CMOS output buffer, which occur when a signal is input to the fifth and sixth MOS transistors, both incorporated in the output control circuit. Further, the third and fourth MOS transistors cause the gate potentials of the first and second MOS transistors to change and at different times. Since the changes in the gate potentials of the first and second MOS transistors are reduced and take place at different times, the deformation of the output-voltage waveform of the output control circuit is reduced. As a result, no through current flows through the first and second MOS transistors which constitute the output buffer.

Further, in the fourth output circuit according to the invention, the seventh MOS transistor and the eighth MOS transistor function as resistor elements. When two complementary output control signals are supplied to these MOS transistors, respectively, the output buffer can be activated or inactivated. Thus, the output circuit can perform tri-state output control.

BRIEF DESCRIPTION OF THE DRAWINGS

FIG. 1 is a diagram showing a conventional output circuit for use in a semiconductor IC;

FIG. 2 is a diagram illustrating an external circuit connected to a semiconductor IC;

FIG. 3 is a diagram showing a plurality of output circuits of a known type;

FIGS. 10 and 11 are circuit diagrams showing the modifications of the second and third embodiments, respectively;

FIGS. 14 and 15 are circuit diagrams showing two modifications of the tri-state output circuits shown in FIG. 13, respectively.

DETAILED DESCRIPTION OF THE PREFERRED EMBODIMENTS

Figure 4:
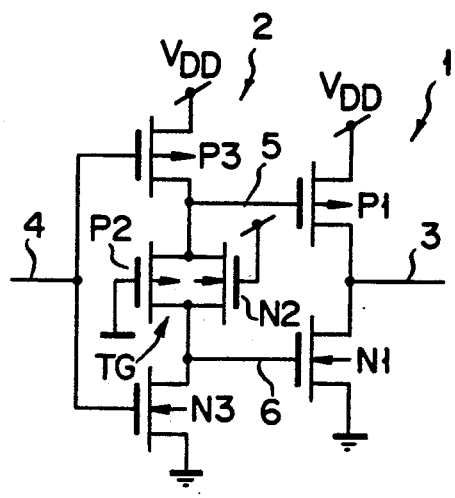
FIG. 4 is a diagram showing an output circuit according to a first embodiment of the present invention.

FIG. 4 shows an output circuit according to one embodiment of the present invention, which is designed for use in a CMOS IC. The output circuit comprises output buffer 1 and output control circuit 2 connected to the input of buffer 1.

As is shown in FIG. 4, output buffer 1 comprises P-channel MOS transistor P1 and N-channel MOS transistor N1. MOS transistors P1 and N1 are connected in series to each other, between a $V_{DD}$ terminal (i.e., the first power-supply terminal) and the ground (i.e., the second power-supply terminal). The connecting point between the drains of these transistors P1 and N1 functions as the signal output node 3 of the output circuit.

Output control circuit 2 comprises two N-channel MOS transistor N2 and N3, and two P-channel MOS transistors P2 and P3. The gates of transistors N2 and P2 are connected to the $V_{DD}$ terminal and the ground, respectively. MOS transistors N2 and P2 are connected in parallel, thus forming a transfer gate TG. N-channel MOS transistor N3 is connected between one end of the transfer gate TG and the ground. P-channel MOS transistor P3 is coupled between the other end of the transfer gate TG and the $V_{DD}$ terminal. The gates of MOS transistors P3 and N3 are connected to each other, thereby forming the signal input node 4 of the output circuit. The ends of the transfer gate TG are connected to the gate of P-channel transistor P1 and the gate of the N-channel transistor N1, and function as first output node 5 and second output node 6, respectively.

All MOS transistors used in the output circuit shown in FIG. 4 have the same channel length, but they have different channel widths as is shown in Table 1. The driving ability of each MOS transistor is proportional to its channel width.

TABLE 1

| Transistor | Channel Width ($\mu$m) |
| --- | --- |
| P1 | 1700 |
| N1 | 700 |
| P2 | 20 |
| N2 | 40 |
| P3 | 260 |
| N3 | 90 |

As is shown in Table 1, MOS transistors P2 and N2 have channel widths less than those of MOS transistors P3 and N3, and function as resistor elements for MOS transistors P3 and N3.

In operation, when the input signal rises from a low ("L") level to a high ("H") level, the potential of second output node 6 falls from the "H" level to the "L" level, and the potential of first output node 5 falls from the "H" level to the "L" level more slowly with a time constant which is determined by the resistance of the transfer gate TG, the junction capacitance of each transistor whose drain or source is coupled to node 5, and the gate capacitance of transistor P1 of output buffer 1.

Figure 5:
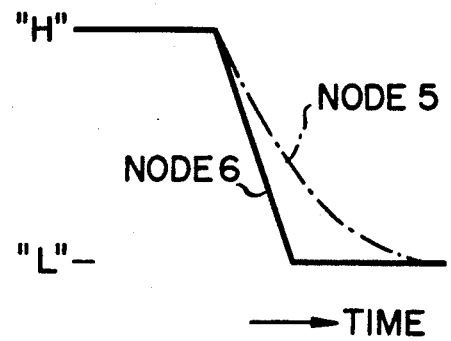
FIG. 5 is a diagram explaining how the voltages at the first and second output nodes of the circuit shown in FIG. 4 change as the signal input to the circuit falls from a high level to a low level.

In other words, the potential fall of first output node 5 is delayed with respect to that of second output node 6, as is illustrated in FIG. 5. This delay is inversely proportional to the size of transistors P2 and N2 which form the transfer gate TG. (That is, the higher the resistance of either transistor, which functions as a resistance element, the greater the delay.)

Figure 6:
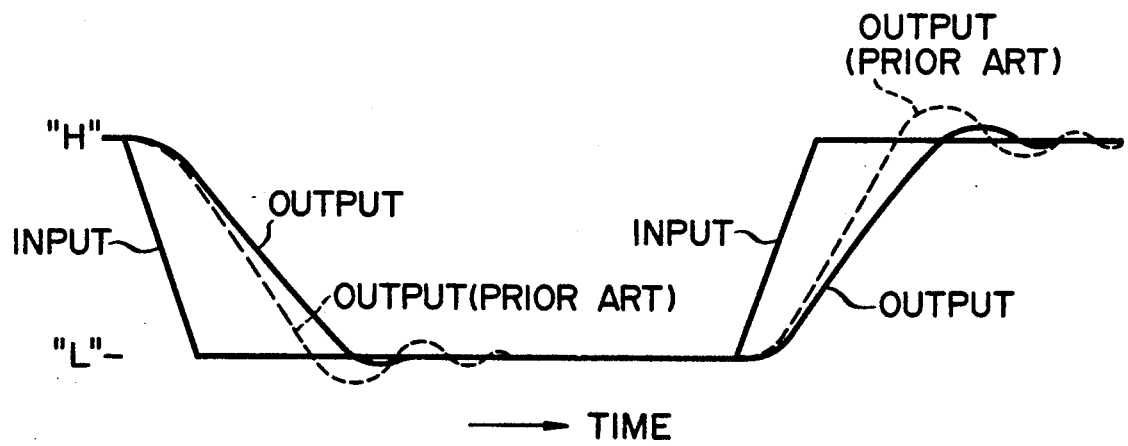
FIG. 6 is a diagram representing the input-output characteristic of the conventional output circuit shown in FIG. 1, and also the input-output characteristic of the output circuit shown in FIG. 4.

Since MOS transistors P2 and N2, which are the components of the transfer gate TG, have channel widths less than those of MOS transistors P3 and N3, the potential of first output node 5 falls from the "H" level to the "L" level, thereby turning on P-channel MOS transistor P1 of output buffer 1, after the potential of second output node 6 has fallen from the "H" level to the "L" level, thus turning off N-channel MOS transistor N1 of output buffer 1. Hence, the through current can be reduced which flows from the $V_{DD}$ terminal to the ground via transistors P1 and N1 when the output of buffer 1 rises from the "L" level to the "H" level. This may be understood from the right half of FIG. 6 which shows the input-voltage waveform of output control circuit 2, and the output-voltage waveform of output buffer 1. The curve indicated by the broken line in FIG. 6 represents the output-voltage waveform of the conventional output circuit.

Figure 7:
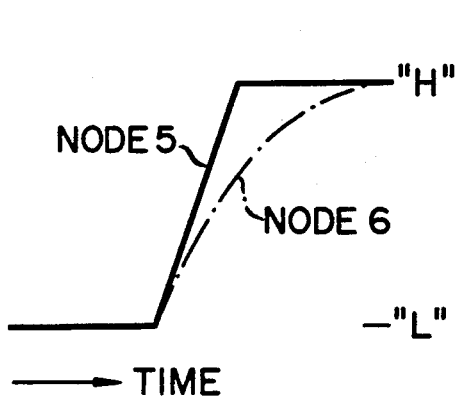
FIG. 7 is a diagram explaining how the voltages at the first and second output nodes of the circuit shown in FIG. 4 change as the signal input to the circuit rises from the low level to the high level.

Conversely, when the input signal falls from "H" level to "L" level, the potential of first output node 5 rises from the "L" level to the "H" level, and the potential of second output node 6 rises from the "L" level to the "H" level more slowly with said time constant. In other words, the potential rise of second output node 6 is delayed with respect to that of first output node 5, as is illustrated in FIG. 7. This delay is also inversely proportional to the size of transistors P2 and N2 which form the transfer gate TG. As has been described, MOS transistors P2 and N2, which are the components of the transfer gate TG, have channel widths less than those of MOS transistors P3 and N3, the potential of second output node 6 rises from the "L" level to the "H" level, thereby turning on N-channel MOS transistor N1 of output buffer 1, after the potential of first output node 5 has risen from the "L" level to the "H" level, thus turning off P-channel MOS transistor P1 of output buffer 1. Hence, the through current can be reduced which flows from the $V_{DD}$ terminal to the ground via transistors P1 and N1 when the output of buffer 1 falls from the "H" level to the "L" level, as can be understood from the left half of FIG. 6. The deformation of the output waveform of the output circuit can thus be reduced.

As has been explained, since transfer gate TG, which comprises parallel-connected MOS transistors P2 and N2 of different conductivities, functions as a resistive load, transistors P1 and N1 constituting output buffer 1 are not simultaneously on when the output signal of P-channel transistor P3 and the output signal of N-channel transistor N3, which have been obtained by inverting the input signal, are supplied to the gates of transistors P1 and N1. Therefore, no through current is generated in the output circuit. Further, since transfer gate TG, i.e., the resistive load, serves to reduce the change in the output level of buffer 1, the deformation of the output waveform, occurring due to the inversion of the output signal, is minimized. Still further, since the input signal is not delayed in the output circuit, the output signal can rise from the "L" level to the "H" level, and fall from the "H" level to the "L" level, within a relatively short time, whereby the output circuit can be operated at high speed.

Figure 8:
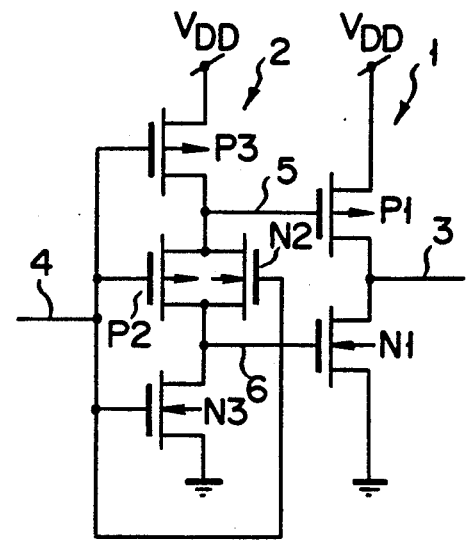
FIGS. 8 and 9 are circuit diagrams illustrating a second and a third embodiment of this invention, respectively.

FIG. 8 shows a modification of the output circuit shown in FIG. 4. In the case of this modification, the gates of transistors P2 and N2, which form a transfer gate GT, are connected to signal input node 4. The resistances of transistors P2 and N2 change in accordance with the level of the signal input to node 4. Therefore, the deformation of the output waveform is more reduced, and the output signal can rise from the "L" level to the "H" level, and fall from the "H" level to the "L" level, within a shorter time, than in the output circuit shown in FIG. 4. Hence, the modified output circuit (FIG. 8) can be operated faster than the circuit illustrated in FIG. 4.

Output control circuit 2 incorporated in either output circuit described above is a CMOS inverter gate. According to the invention, circuit 2 can be replaced by another kind of a logic gate such as a NAND gate or a NOR gate.

Figure 9:
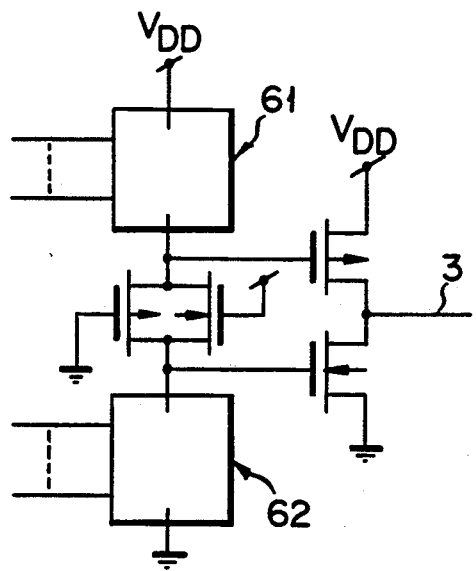

FIG. 9 shows a second embodiment of the invention, which includes a logic gate comprising first logic-element section 61 and second logic-element section 62. As can be understood from FIG. 9, sections 61 and 62 correspond to MOS transistor P3 and N3 (FIGS. 4 and 8), respectively.

FIGS. 10 and 11 illustrate two modifications of the output circuit shown in FIG. 9. The first modified circuit includes a two-input NAND gate, and the second modified circuit has a two-input NOR gate.

As is illustrated in FIG. 10, in the case of the first modified circuit, first logic-element section 61 comprises two P-channel MOS transistors P31 and P32 which have a channel width of 260 μm and are connected in parallel to each other. First input signal $IN_1$ is supplied to the gate of MOS transistor P31, and second input signal $IN_2$ is supplied to the gate of MOS transistor P32. Also as is shown in FIG. 10, second logic-element section 62 comprises two N-channel MOS transistors N31 and N32 which have a channel width of 180 μm and are connected in series with each other. First input signal $IN_1$ is supplied to the gate of MOS transistor N31, and second input signal $IN_2$ is supplied to the gate of MOS transistor N32. Hence, logic-element sections 61 and 62 constitute a two-input NAND gate.

As is shown in FIG. 11, in the case of the second modified output circuit, first logic-element section 61 comprises two P-channel MOS transistors P31 and P32 which have a channel width of 520 μm and are connected in series to each other. First input signal $IN_1$ is supplied to the gate of MOS transistor P31, and second input signal $IN_2$ is supplied to the gate of MOS transistor P32. Also as is shown in FIG. 10, second logic-element section 62 comprises two N-channel MOS transistors N31 and N32 which have a channel width of 90 μm and are connected in parallel with each other. First input signal $IN_1$ is supplied to the gate of MOS transistor N31, and second input signal $IN_2$ is supplied to the gate of MOS transistor N32. Hence, logic-element sections 61 and 62 constitute a two-input NOR gate.

Figure 12:
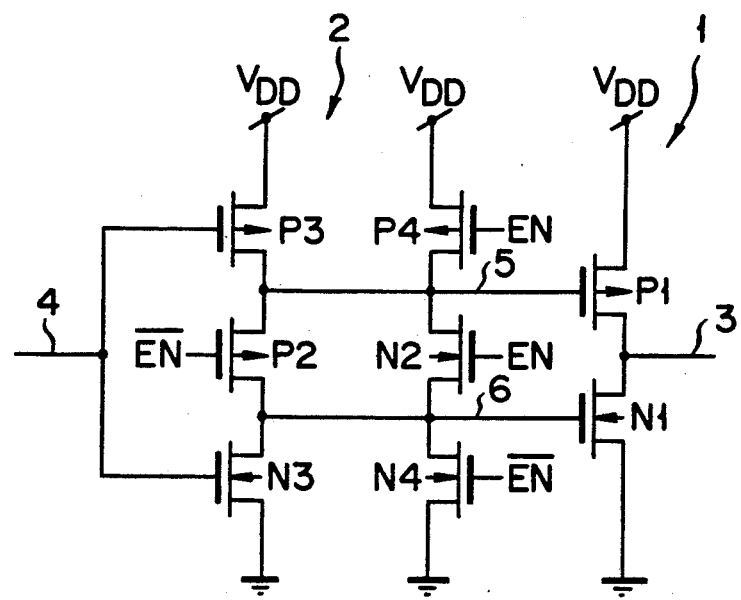
FIG. 12 is a diagram showing a tri-state output circuit according to the present invention.

FIG. 12 illustrates a tri-state output circuit which is another embodiment of the present invention. This circuit is identical to the output circuit shown in FIG. 4, except for the following features. First, P-channel MOS transistor P4 is connected between a $V_{DD}$ terminal and first output node 5. Secondly, N-channel MOS transistor N4 is connected between second output node 6 and the ground. Thirdly, a first output control signal (i.e., an output enable signal) EN is supplied to the gates of MOS transistors P4 and N2. Further, a second output control signal $\overline{EN}$, which is complementary to the first output control signal EN, is supplied to the gates of MOS transistors P2 and N4.

All MOS transistors used in the output circuit shown in FIG. 12 have the same channel length, but they have different channel widths as is shown in Table 2. The driving ability of each MOS transistor is proportional to its channel width.

TABLE 2

| Transistor | Channel Width (μm) |
|---|---|
| P1 | 1700 |
| N1 | 700 |
| P2 | 20 |
| N2 | 30 |
| P3 | 300 |
| N3 | 100 |
| P4 | 300 |
| N4 | 100 |

As is shown in Table 2, MOS transistors P2 and N2 have channel widths less than those of MOS transistors P3 and N3, and also than those of MOS transistors P4 and N4. Further, MOS transistors P3 and N3 have sizes great enough to drive the MOS transistors P1 and N1 forming output buffer 1.

The tri-state output circuit is active as long as signals EN and $\overline{EN}$ are at the "H" level and the "L" level, respectively. In this condition, MOS transistor P4 is off; MOS transistor P2 is on; MOS transistor N2 is on; and MOS transistor N4 is off. Hence, as in the output circuit shown in FIG. 4, the signal input to node 4 is inverted by output control circuit 2 and again inverted by output buffer 1. As a result, the potential of first output node 5 and the potential of second output node 6 change. In accordance with changes in these potentials, the current flowing between nodes 5 and 6 changes. Assuming that the input signal is at the "H" level, the potentials of both output nodes 5 and 6 are at the "L" level and stable. When the input signal falls from the "H" level to the "L" level, the potential of first output node 5 first rises to the "H" level, thus turning off MOS transistor P1. As a result, transistors P2 and N2 are turned on, and a voltage is applied from first output node 5 to second output node 6. Thereafter, the potential of second output node 6 gradually rises to the "H" level. Then, MOS transistor N2 slowly comes into the "off" state. Once MOS transistor N2 has been turned off completely, the voltage is applied from first output node 5 to second output node 6 through only MOS transistor P2, and transistor N1 of output buffer 1 is turned on, whereby the output signal falls to the "L" level. Since MOS transistors P2 and N2 have channel widths less than those of MOS transistors P3, N3, P4 and N4, the potentials of both output nodes 5 and 6 can be controlled, and the time which the output signal requires to fall from the "H" level to the "L" level can therefore be controlled. Thus, MOS transistors P1 and N1, which form output buffer 1, can be prevented from being on simultaneously, and a transient through current can be reduced.

Also, when the input signal rises from the "L" level to the "H" level, the time which the output signal needs to rise to the "H" level can be controlled. Even when the output signal changes from an high-impedance level to the "H" or "L" level, the potentials of both output nodes 5 and 6 can be controlled to reduce the deformation of the output waveform, since MOS transistors P2 and N2 have channels widths less than those of MOS transistors P4 and N4.

The tri-state output circuit is inactive as long as signals EN and $\overline{EN}$ are at the "L" level and the "H" level, respectively. In this condition, MOS transistor P4 is on; MOS transistor P2 is off; MOS transistor N2 is off; and MOS transistor N4 is on. Thus, both MOS transistors P1 and N1 of output buffer 1 are off, and output node 3 is at high impedance.

Output control circuit 2 of the tri-state output circuit (FIG. 12) may include a logic gate such as a NAND gate or a NOR gate.

Figure 13:
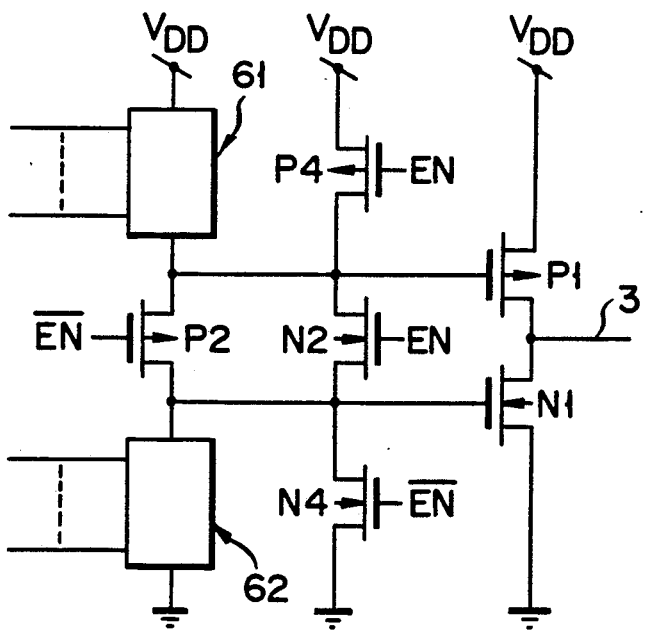
FIG. 13 is a diagram showing another type of a tri-state output circuit according to the present invention.

FIG. 13 shows another embodiment of the invention, which includes a logic gate comprising first logic-element section 61 and second logic-element section 62. As can be understood from FIG. 9, sections 61 and 62 correspond to MOS transistor P3 and N3 (FIGS. 4 and 8), respectively.

FIGS. 14 and 15 illustrate two modifications of the output circuit shown in FIG. 13. The first modified circuit includes a two-input NAND gate of the tri-state type, and the second modified circuit has a two-input NOR gate of the tri-state type.

As is illustrated in FIG. 14, in the case of the first modified circuit, first logic-element section 61 comprises a plurality of P-channel MOS transistors, and and second logic-element section 62 comprises a plurality of N-channel MOS transistors. This modified circuit is identical with the circuit shown in FIG. 10, except that MOS transistors P31 and P32 have a channel width of 300 μm, and MOS transistors N31 and N32 have a channel width of 200 μm.

As is shown in FIG. 15, in the case of the second modified circuit, first logic-element section 61 comprises a plurality of P-channel MOS transistors, and second logic-element section 62 comprises a plurality of N-channel MOS transistors. This modified circuit is identical with the circuit shown in FIG. 11, except that MOS transistors P31 and P32 have a channel width of 600 μm, and MOS transistors N31 and N32 have a channel width of 100 μm.

As has been described above, in the output circuit according to the present invention, a transient through current, which flows when the output signal is inverted, is reduced, and the deformation of the output waveform is reduced, without using any external circuit. Further, additional transistors can used for activating or inactivating the output buffer of the output circuit, and output control signals can be supplied to these transistors, whereby the output circuit functions as a tri-state output circuit.

What is claimed is:
1. An output circuit for use in a semiconductor IC, comprising:
a first MOS transistor of a first conductivity type and a second MOS transistor of a second conductivity type connected in series to each other between a first power supply and a second power supply, and constituting an output buffer;
a third MOS transistor of the first conductivity type and a fourth MOS transistor of the second conductivity type connected in parallel to each other between gates of said first and second MOS transistor, wherein the gates of the third and fourth MOS transistors are connected respectively to a first and a second predetermined bias voltage to provide a fixed resistance value;

a first logic-element section comprising at least one fifth MOS transistor of the first conductivity type connected between said first power supply and the gate of said first MOS transistor, said fifth MOS transistor being connected to receive an input signal; and a second logic-element section comprising at least one sixth MOS transistor of the second conductivity type connected between said second power supply and the gate of said second MOS transistor, said sixth MOS transistor being connected to receive the input signal, wherein the third and fourth MOS transistors have a channel width smaller than that of said fifth and sixth MOS transistor.

2. The output circuit according to claim 1, wherein said third MOS transistor has a gate connected to the second power supply, and said fourth MOS transistor has a gate connected to the first power supply.

3. The output circuit according to claim 1, in which:
the first logic-element section forms a two-input NAND gate comprising the fifth and a seventh MOS transistor of the first conductivity type connected in parallel between the first power supply and the gate of the first MOS transistor, the seventh MOS transistor being connected to receive a second input signal; and the second logic-element section forms a two-input NAND gate comprising the sixth and an eighth MOS transistor of the second conductivity type connected in series between the second power supply and the gate of the second MOS transistor, the eighth MOS transistor being connected to receive the second input signal.

4. The output circuit according to claim 1, in which:
the first logic-element section forms a two-input NOR gate comprising the fifth and a seventh MOS transistor of the first conductivity type connected in series between the first power supply and the gate of the first MOS transistor, the seventh MOS transistor being connected to receive a second input signal; and the second logic-element section forms a two-input NOR gate comprising the sixth and eighth MOS transistor of the second conductivity type connected in parallel between the second power supply and the gate of the second MOS transistor, the eighth MOS transistor being connected to receive the second input signal.

5. An output circuit for use in a semiconductor IC, comprising:
a first MOS transistor of a first conductivity type and a second MOS transistor of a second conductivity type connected in series to each other between a first power supply and a second power supply, and constituting an output buffer;

a third MOS transistor of the first conductivity type and a fourth MOS transistor of the second conductivity type connected in parallel to each other between gates of said first and second MOS transistors, wherein the gates of the third and fourth MOS transistors are connected respectively to a first and a second predetermined fixed bias voltage to provide a fixed resistance value;

a first logic-element section comprising a fifth MOS transistor of the first conductivity type connected between the first power supply and the gate of the first MOS transistor, the fifth MOS transistor being connected to receive an input signal, wherein the first logic-element section forms a two-input NAND gate comprising the fifth and a seventh MOS transistor of the first conductivity type connected in parallel between the first power supply and the gate of the first MOS transistor, the seventh MOS transistor being connected to receive a second input signal; and a second logic-element section comprising a sixth MOS transistor of the second conductivity type connected between the second power supply and the gate of the second MOS transistor, the sixth MOS transistor being connected to receive the input signal, wherein the second logic-element section forms a two-input NAND gate comprising the sixth and an eighth MOS transistor of the second conductivity type connected in series between the second power supply and the gate of the second MOS transistor, the eighth MOS transistor being connected to receive the second input signal.

6. The output circuit according to claim 5, in which the gate of said third MOS transistor is connected to the second power supply and the gate of said fourth MOS transistor is connected to the first power supply.

7. An output circuit for use in a semiconductor IC, comprising:
a first MOS transistor of a first conductivity type and a second MOS transistor of a second conductivity type connected in series to each other between a first power supply and a second power supply, and constituting an output buffer;

a third MOS transistor of the first conductivity type and a fourth MOS transistor of the second conductivity type connected in parallel to each other between gates of said first and second MOS transistors, wherein the gates of the third and fourth MOS transistors are connected respectively to a first and a second predetermined fixed bias voltage to provide a fixed resistance value;

a first logic-element section comprising a fifth MOS transistor of the first conductivity type connected between the first power supply and the gate of the first MOS transistor, the fifth MOS transistor being connected to receive an input signal, wherein the first logic-element section forms a two-input NOR gate comprising the fifth and a seventh MOS transistor of the first conductivity type connected in series between the first power supply and the gate of the first MOS transistor, the seventh MOS transistor being connected to receive a second input signal; and a second logic-element section comprising a sixth MOS transistor of the second conductivity type connected between the second power supply and the gate of the second MOS transistor, the sixth MOS transistor being connected to receive the input signal, wherein the second logic-element section forms a two-input NOR gate comprising the sixth and an eighth MOS transistor of the second conductivity type connected in parallel between the second power supply and the gate of the second MOS transistor, the eighth MOS transistor being connected to receive the second input signal.

8. The output circuit according to claim 7, in which the gate of said third MOS transistor is connected to the second power supply and the gate of said fourth MOS transistor is connected to the first power supply.

9. A tri-state output circuit for use in a semiconductor IC and responsive to the level of an output control signal, comprising:

a first MOS transistor of a first conductivity type and a second MOS transistor of a second conductivity type connected in series to each other between a first power supply and a second power supply, and constituting an output buffer;

a first logic-element section comprising a third MOS transistor of the first conductivity type connected between the first power supply and the gate of the first MOS transistor, the third MOS transistor being connected to receive an input signal;

a second logic-element section comprising a fourth MOS transistor of the second conductivity type connected between the second power supply and the gate of the second MOS transistor, the fourth MOS transistor being connected to receive the input signal; and output control means, connected to the first power supply, the second power supply, the gate of the first MOS transistor, and the gate of the second MOS transistor, and connected to receive the output control signal, for connecting the first power supply to the gate of the first MOS transistor and for connecting the second power supply to the gate of the second MOS transistor, at times when the output control signal is at a first level, to turn off both the first MOS transistor and the second MOS transistor, and for connecting the gate of the first MOS transistor to the gate of the second MOS transistor, at times when the output control signal is at a second level, to turn on one of the first MOS transistor and the second MOS transistor.

10. The tri-state output circuit according to claim 9, in which:

the first logic-element section forms a two-input NAND gate comprising the third and a fifth MOS transistor of the first conductivity type connected in parallel between the first power supply and the gate of the first MOS transistor, the fifth MOS transistor being connected to receive a second input signal; and the second logic-element section forms a two-input NAND gate comprising the fourth and a sixth MOS transistor of the second conductivity type connected in series between the second power supply and the gate of the second MOS transistor, the sixth MOS transistor being connected to receive the second input signal.

11. The tri-state output circuit according to claim 9, in which:

the first logic-element section forms a two-input NOR gate comprising the third and a fifth MOS transistor of the first conductivity type connected in series between the first power supply and the gate of the first MOS transistor, the fifth MOS transistor being connected to receive a second input signal; and the second logic-element section forms a two-input NOR gate comprising the fourth and a sixth MOS transistor of the second conductivity type connected in parallel between the second power supply and the gate of the second MOS transistor, the sixth MOS transistor being connected to receive the second input signal.

12. The tri-state output circuit according to claim 11, in which the output control means includes:

a seventh MOS transistor of the first conductivity type connected between the first power supply and the gate of the first MOS transistor, the seventh MOS transistor being connected to receive the output control signal;

an eighth MOS transistor of the second conductivity type connected between the second power supply and the gate of the second MOS transistor, the eighth MOS transistor being connected to receive the complement of the output control signal;

a ninth MOS transistor of the first conductivity type connected between the gate of the first MOS transistor and the gate of the second MOS transistor, the ninth MOS transistor being connected to receive the complement of the output control signal; and a tenth MOS transistor of the second conductivity type connected between the gate of the first MOS transistor and the gate of the second MOS transistor, the tenth MOS transistor being connected to receive the output control signal.

13. The tri-state output circuit according to claim 10, in which the output control means includes:

a seventh MOS transistor of the first conductivity type connected between the first power supply and the gate of the first MOS transistor, the seventh MOS transistor being connected to receive the output control signal;

an eighth MOS transistor of the second conductivity type connected between the second power supply and the gate of the second MOS transistor, the eight MOS transistor being connected to receive the complement of the output control signal;

a ninth MOS transistor of the first conductivity type connected between the gate of the first MOS transistor and the gate of the second MOS transistor, the ninth MOS transistor being connected to receive the complement of the output control signal; and a tenth MOS transistor of the second conductivity type connected between the gate of the first MOS transistor and the gate of the second MOS transistor, the tenth MOS transistor being connected to receive the output control signal.

14. The tri-state output circuit according to claim 9, in which the output control means includes:

a fifth MOS transistor of the first conductivity type connected between the first power supply and the gate of the first MOS transistor, the fifth MOS transistor being connected to receive the output control signal;

a sixth MOS transistor of the second conductivity type connected between the second power supply and the gate of the second MOS transistor, the sixth MOS transistor being connected to receive the complement of the output control signal;

a seventh MOS transistor of the first conductivity type connected between the gate of the first MOS transistor and the gate of the second MOS transistor, the seventh MOS transistor being connected to receive the complement of the output control signal; and an eighth MOS transistor of the second conductivity type connected between the gate of the first MOS transistor and the gate of the second MOS transistor, the eight MOS transistor being connected to receive the output control signal.

15. The tri-state output circuit according to claim 14, in which the seventh and eighth MOS transistors have channel widths smaller than those of said third, fourth, fifth, and sixth MOS transistors.

* * * * *